US012771351B2

(12) United States Patent
Chu et al.

(10) Patent No.: US 12,771,351 B2
(45) Date of Patent: Oct. 20, 2026

(54) DUAL LAYER LOGIC FOR PERFORMANCE OPTIMIZATION

(71) Applicant: INTERNATIONAL BUSINESS MACHINES CORPORATION, Armonk, NY (US)

(72) Inventors: Albert M. Chu, Nashua, NH (US); Brent A. Anderson, Jericho, VT (US); Ruilong Xie, Niskayuna, NY (US); Lawrence A Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 18/609,163

(22) Filed: Mar. 19, 2024

(65) Prior Publication Data

US 2025/0300661 A1 Sep. 25, 2025

(51) Int. Cl.

| | |
|---|---|
| ***H03K 19/0948*** | (2006.01) |
| ***H03K 19/17736*** | (2020.01) |
| ***H03K 19/1776*** | (2020.01) |
| ***H10W 90/00*** | (2026.01) |
| *H10W 90/20* | (2026.01) |

(52) U.S. Cl.

CPC ..... *H03K 19/0948* (2013.01); *H03K 19/1774* (2013.01); *H03K 19/1776* (2013.01); *H10W 90/00* (2026.01); *H10W 90/297* (2026.01)

(58) Field of Classification Search

None

See application file for complete search history.

(56) References Cited

U.S. PATENT DOCUMENTS

| | | | | |
|---|---|---|---|---|
| 7,511,536 | B2 | 3/2009 | Amarilio et al. | |
| 2011/0315943 | A1 | 12/2011 | Rinerson et al. | |
| 2021/0296155 | A1* | 9/2021 | Or-Bach | H01L 21/743 |
| 2022/0165707 | A1* | 5/2022 | Song | H01L 25/105 |
| 2023/0298996 | A1 | 9/2023 | Abu-Rahma et al. | |
| 2023/0299001 | A1 | 9/2023 | Narayan et al. | |
| 2023/0378339 | A1 | 11/2023 | Or-Bach | |
| 2023/0420283 | A1* | 12/2023 | Or-Bach | H10B 12/053 |

FOREIGN PATENT DOCUMENTS

WO 2016022291 A2 2/2016

OTHER PUBLICATIONS

Chen et al., "Implementation of memory stacking on logic controller by using 3DIC 300mm backside TSV process integration", 2016 International Symposium on VLSI Technology, Systems and Applicant, Apr. 2016, pp. 1-3.

* cited by examiner

*Primary Examiner* — Anh Q Tran

(74) *Attorney, Agent, or Firm* — Harrity & Harrity, LLP

(57) ABSTRACT

A semiconductor device includes a first logic layer including first complementary metal oxide (CMOS) logic devices. A second logic layer is stacked on the first logic layer and includes second CMOS logic devices. A placement of the second CMOS logic devices relative to the first CMOS logic devices increases device density and reduces via count.

20 Claims, 7 Drawing Sheets

DUAL LAYER LOGIC FOR PERFORMANCE OPTIMIZATION

BACKGROUND

The present invention generally relates to semiconductor devices and processing methods, and more particularly to stacked logic devices configured in two levels to reduce wiring and improve performance.

Logic devices are typically fabricated in a single layer across a semiconductor chip. In many instances memory state logic and combinatorial logic are integrated in a same level where active regions are formed. As such, metal structures that provide connections to the memory state logic and combinatorial logic device compete for available space. Further, metal structures can contribute to fabrication expense and can increase failure risk especially when logic devices are densely packed.

SUMMARY

In accordance with an embodiment of the present invention, a semiconductor device includes a first logic layer including first complementary metal oxide (CMOS) logic devices. A second logic layer is stacked on the first logic layer and includes second CMOS logic devices. A placement of the second CMOS logic devices relative to the first CMOS logic devices increases device density and reduces via count.

In accordance with another embodiment of the present invention, a semiconductor device includes a first back end of line (BEOL) layer and a first logic layer including first complementary metal oxide (CMOS) logic devices on the first BEOL layer. A second logic layer is stacked on the first logic layer and includes second CMOS logic devices. A second BEOL layer is on the second logic layer. A placement of the second CMOS logic devices relative to the first CMOS logic devices increases device density and reduces via count.

In accordance with another embodiment of the present invention, a semiconductor device, includes a first back end of line (BEOL) layer and a first logic layer including first complementary metal oxide (CMOS) logic devices on the first BEOL layer, the first BEOL layer supplies a first supply voltage to the first CMOS logic devices. A second logic layer is stacked on the first logic layer and includes second CMOS logic devices. A second BEOL layer is on the second logic layer, the second BEOL layer supplies a second supply voltage to the second CMOS logic devices and the first and second supply voltages have different values. A placement of the second CMOS logic devices relative to the first CMOS logic devices enables a linear arrangement of vias that traverse the first logic layer and the second logic layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
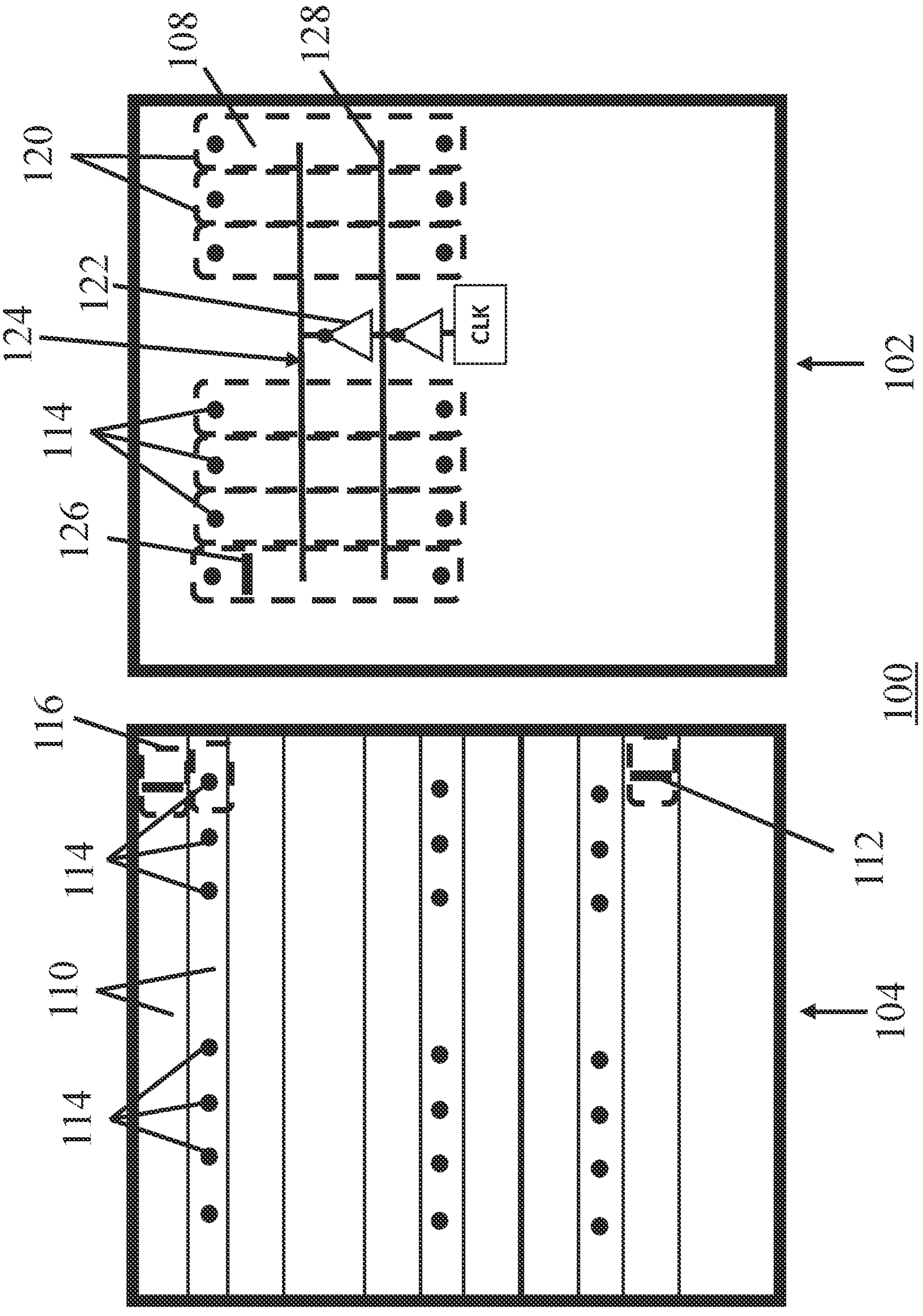
FIG. 1 shows layout views of two logic layers that are orthogonally arranged when stacked in a manner that increases device density and decreases via count, in accordance with an embodiment of the present invention.

In accordance with embodiments of the present invention, devices and methods are described which include at least two layers of logic devices on a semiconductor device. Each layer of logic devices includes a specific device type. In an embodiment, the device types can include a memory state device type on one layer and a combinatorial device type on another layer. In another embodiment, memory cells can be disposed on one layer and memory peripheral logic can be disposed on a second layer.

The two device types can be arranged relative to one another to reduce wiring, increase device density and improve performance. In an embodiment, cells of one layer can be orthogonally disposed to cells in a second layer. In other embodiments, the cells can be parallel between the two layers. In an embodiment, gate structures can be orthogonally disposed between the two layers.

In other embodiments, the gate structures can be aligned between the two layers. In such an embodiment, the first level and second level logic placement can be offset by, e.g., ½ contacted poly pitch (CPP) to align gates and active regions between different levels. A linear layout can be achieved for the memory state logic where vias to the combinatorial logic level can be placed in a linear (straight line) configuration across the device.

In accordance with embodiments of the present invention, a stacked logic device can be fabricated with complementary metal oxide semiconductor (CMOS) structures on two levels. In this way, memory state logic and combinatorial logic can be powered and connected independently of one another. For example, memory state logic on a first level can have a different supply voltage (e.g., Vdd) than combinatorial logic on a second level. In addition, different threshold voltages and a different number of threshold voltages can be employed between the logic levels. Vdd for memory state logic can be different than Vdd for combinatorial logic without needing additional metal wiring resources to provide a connection to Vdd. The logic layers can have different relationships. For example, the memory state logic can be wired to save a state and power down corresponding combinatorial logic to conserve energy.

The two levels can be connected to respective sides of the semiconductor device by metal structures. For example, the first logic level can be connected to a backside back end of line (BEOL) metal layer while the second logic level can be connected to a frontside BEOL metal layer. The frontside and the backside can be connected by vias that can connect the backside BEOL layer to the frontside BEOL layer. Metal structures of the first level can be connected to metal structures of the second level using vias including, e.g., through silicon vias. Wiring connections of the first level devices can be on the backside while wiring connections of the second level devices can be on the frontside. Clock signals and a clock network can be accessed from the backside BEOL wiring levels to the memory state logic level.

In a particularly useful configuration, cell orientation of memory state logic can be orthogonal to cell orientation of combinatorial logic. In other embodiments, cell orientation of memory state logic and combinatorial logic can be in a same orientation.

Inputs and outputs can be streamlined in accordance with embodiments. For example, memory state logic inputs and/or outputs can be connected on or through the second level (e.g., the combinatorial logic level). Memory state logic can have input and output signals connect to a same side of a memory state logic cell. Memory state logic can have input and output signals within two CPP distance from each other.

The memory state logic can include flip-flops (FF). Flip-flops include a cross couple between logic components. Stacking devices permits cross-coupling connections that can be disposed at a higher density on the first level. In addition, the flip-flops can be placed anywhere in a flip-flop circuit column. Clock circuitry can be routed after placement of the flip-flops to ensure proper clock distribution.

Dedicating memory state logic to specific levels significantly reduces level to level logic wiring. In one example, a 7-14 times reduction in level-to-level vias for stacked devices can be achieved. Cost and complexity are minimized by dedicating memory state logic to a separate level. Very low-density connections between levels, cross-couple connections and highest density logic can be dedicated to the memory state logic level.

Referring now to the drawings in which like numerals represent the same or similar elements and initially to FIG. 1, a semiconductor device 100 is shown in accordance with embodiments of the present invention. The semiconductor device 100 includes a first level or layer 102 and a second level or layer 104. The layers 102 and 104 are shown in layout views adjacent to one another to highlight features between the layers 102 and 104. In the embodiment shown, layer 102 includes memory storage logic and layer 104 includes combinatorial logic. It should be understood that the layers 102 and 104 can include other types of logic and the order of stacking can be reversed. The memory storage logic of layer 102 can include flip-flop devices or other memory logic devices. The combinatorial logic of layer 104 can include logic gates such as, e.g., AND, OR and NOT gates. The combinatorial logic can be arranged in rows of combinatorial logic devices 110. The memory storage logic can be arranged in columns of memory state logic devices 108.

The two layers 102, 104 of logic devices of the semiconductor device 100 are stacked on top of one another. Each layer 102, 104 includes a uniform device type. In an embodiment, the device types can include a memory state device type on one layer 102 and a combinatorial device type on another layer 104. In other embodiments, the layers 102 and 104 can have different relationships. For example, the memory state logic of layer 102 can include memory and corresponding combinatorial logic of layer 104 can be stacked directly over the memory. The memory can be wired to save a state (e.g., of the combinatorial logic of layer 104) and power down the corresponding combinatorial logic of layer 104 to conserve energy when the combinatorial logic of layer 104 is no longer needed. This localized power down can prevent the need to power up larger portions of the device that are not needed. In another embodiment, memory cells of layer 102 can have supporting memory peripheral logic disposed on layer 104.

The device types on each layer 102 and 104 can be arranged relative to one another to reduce wiring, increase device density and improve performance. For example, in an embodiment, gates 126 on layer 102 can be orthogonally disposed relative to gates 112 of layer 104. In other embodiments, the gates 126 and 112 can be in a same direction (aligned) between the two layers 102, 104. Since each layer 102, 104 includes a specific device type, each device type on each layer 102, 104 can be arranged in a more uniform manner, increasing device density and taking advantage of wiring opportunities on respective free sides (e.g., a backside and a frontside) for each layer 102, 104.

In accordance with embodiments of the present invention, a stacked logic device can be fabricated with complementary metal oxide semiconductor (CMOS) structures on each layer 102, 104. This can include N and P type diffusion regions on each level (e.g., for both layers 102 and 104). In this way, memory state logic and combinatorial logic can be powered and connected independently of one another. For example, memory state logic on layer 102 can have a different supply voltage (e.g., Vdd) than combinatorial logic on layer 104. In addition, different threshold voltages and a different number of threshold voltages can be employed between the logic levels. For example, layer 102 can include a single threshold voltage across the level while layer 104 can have two or three different threshold voltages across the level. Likewise, independent threshold voltages (Vdd) can be supplied to each layer 102, 104 without the need of additional wiring to provide the supply voltage to the components that it serves or a completely separate metal network to bring in a second supply voltage. For example, a supply voltage (Vdd1) for memory state logic of layer 102 can be different than a supply voltage (Vdd2) for combinatorial logic of layer 104. With only one Vdd value on each layer 102, 104, wiring for additional Vdd values is not needed. However, in some embodiments, a second supply voltage can be tapped, if needed, using vias that extend through from the other side of the device.

In an embodiment, cells 120 of layer 102 and cells 116 of layer 104 can be placed to provide a beneficial offset between the cells 116 and 120. Cells 116 can include logic gates and cells 120 can include flip-flops or other memory logic. Cells 116 and 120 can be arranged to permit overlap between the cells 116 and 120 to permit local connections between the layers 102 and 104 but also can provide placement for other components to avoid shorts and provide adequate heat dissipation.

A linear layout can be achieved for the memory state logic in layer 102 where vias 114 to the combinatorial logic of layer 104 can be placed in a linear (straight line) configuration across the device 100. The vias 114 can be aligned in between circuit rows and can serve, e.g., as D and Q pins for flip-flop devices in layer 102.

Cell orientation of memory state logic of layer 102 can be orthogonal to cell orientation of combinatorial logic of layer 104. This can be seen from illustrative orientation of the gates 126 and 112 between the layers 102 and 104, respectively. In this instance, active regions which are orthogonal to the gates 126 and 112 would also be orthogonal relative to each other in layers 102, 104. In other embodiments, cell orientation of memory state logic and combinatorial logic can be in a same orientation with gate 112 and 126 is a same direction (e.g., parallel to each other). The active regions would also be orthogonal relative to each other in layers 102, 104.

In one example, where the gates 112 and 126 are parallel to each other (see FIG. 3), cells 116 can be offset from cells 120 by, e.g., ½ contacted poly pitch (CPP) to align gates 112, 126 and active regions (which are orthogonal to their respective gates 112, 126 on each level) between the different layers 102, 104.

A clock network 124 can be fabricated as part of layer 102 and/or be included in back end of line (BEOL) structures associated with a corresponding side of the layer 102. The clock network 124 can include buffers 122 and clock signal lines 128 that carry clock signals (CLK). The clock signals (CLK) can be accessed by the memory state logic of layer 102 from, e.g., backside BEOL wiring levels or from components as part of the memory state logic of layer 102. Since layer 102 includes a plurality of memory state logic devices, such as flip-flops, the flips flops can be arranged to easily support multi-bit processing by having a number of flip-flops adjacent to one another in an array (e.g., less wiring and therefore less signal delay). In addition, the clock network 124 can be optimized by more directly distributing clock signals to the plurality of components on layer 102 (e.g., flip flops). With fewer obstacles (e.g., combinatorial logic gates), routing of clock lines can be more direct.

Figure 2:
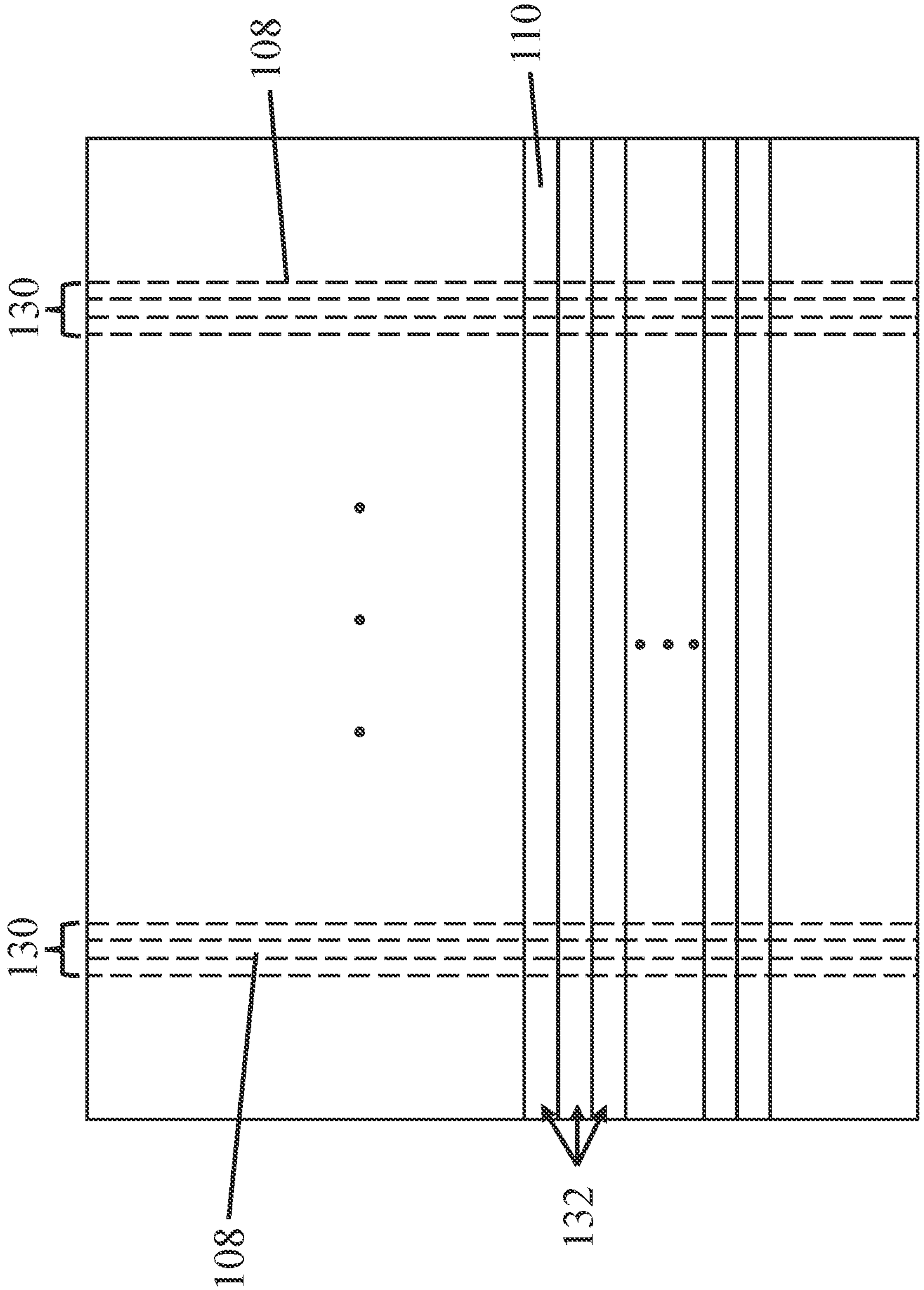
FIG. 2 shows a layout view of the two logic layers stacked orthogonally in a manner that increases device density and decreases via count, in accordance with an embodiment of the present invention.

Referring to FIG. 2, a layout view for device 100 having layer 104 on top of layer 102 is illustratively shown. Combinatorial logic devices 110 are arranged in rows 132 while memory state logic devices 108 are arranged in columns 130. The rows 132 and columns 130 exist across the device 100 but are depicted as portions for clarity. The structures on layer 102 are shown as dashed lines to indicate that layer 104 is on top of layer 102. The memory state logic devices 108 can include flip-flops. In an embodiment, by creating a memory state logic level, flexibility for placement of flip-flops is increased. Flip-flops can be placed anywhere in the columns 130. This provides for flexibility in routing a clock tree, which can be optimized based on the placement of flip-flops, which in turn, can also be determined based on the locations of the combinatorial logic devices 110.

Flip-flops include cross-couple connections within their circuitry. These cross-couple connections consume real estate on a device. Stacking devices permits cross-couple connections that can be provided at a higher density on the layer 102 since greater freedom is afforded with a memory state logic level. In addition, with greater placement freedom for the flip-flops (e.g., anywhere in a column 130) higher device density can be achieved and better performance by reducing wiring and better optimization of clock circuitry.

Figure 3:
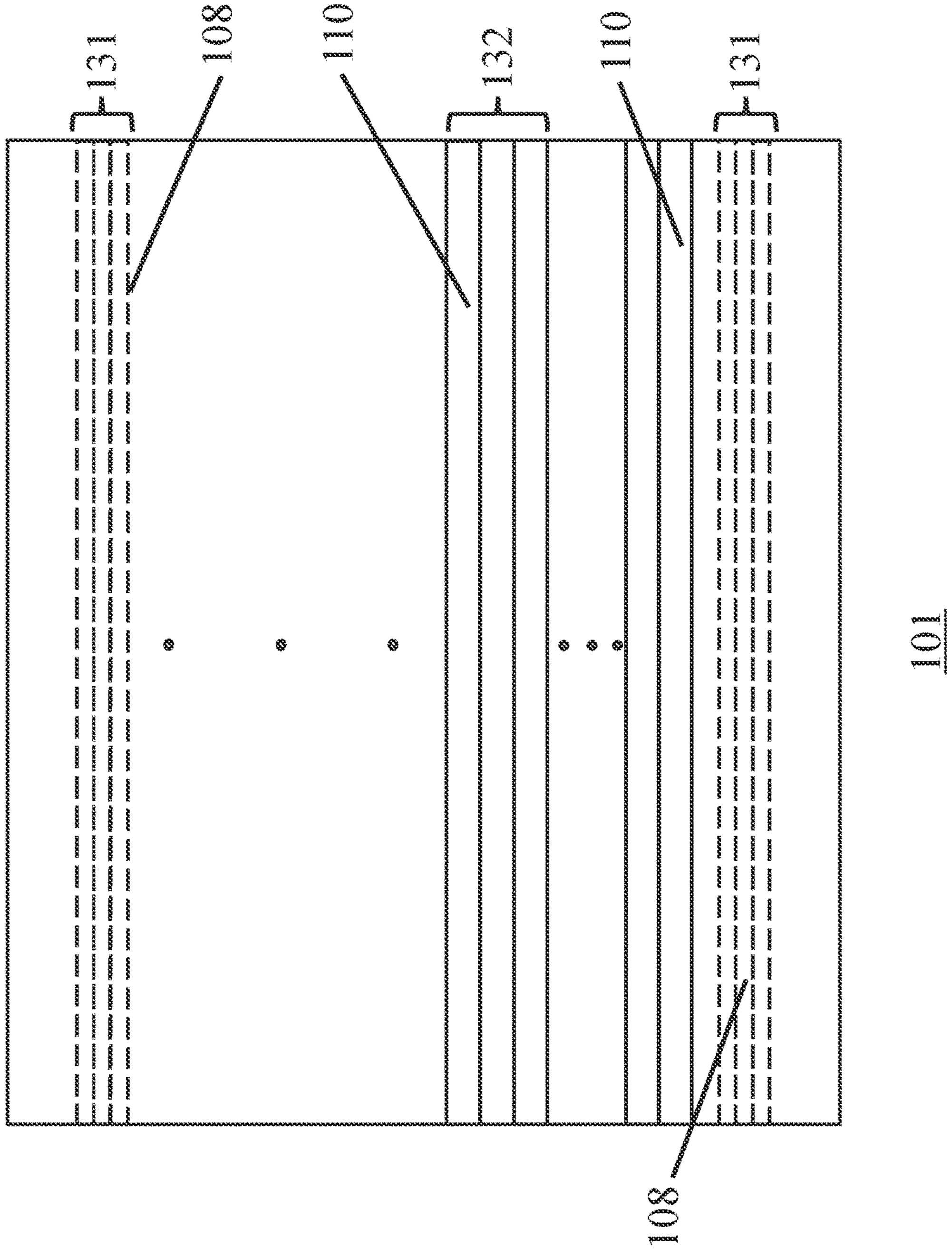
FIG. 3 shows a layout view of the two logic layers stacked in a same direction in a manner that increases device density and decreases via count, in accordance with an embodiment of the present invention.

Referring to FIG. 3, a layout view for device 101 having layer 104 on top of layer 102 is illustratively shown. Combinatorial logic devices 110 are arranged in rows 132 and memory state logic devices 108 are arranged in rows 131. Said differently, combinatorial logic devices 110 are aligned with or are parallel to the memory state logic devices 108. The rows 131, 132 exist across the device 101 but are depicted as portions for clarity. The structures on layer 102 are shown as dashed lines to indicate that layer 104 is on top of layer 102. The memory state logic devices 108 can include flip-flops. In an embodiment, by creating a memory state logic level, flexibility for placement of flip-flops is increased. Flip-flops can be placed anywhere in the rows 131. This provides for flexibility in routing a clock tree, which can be optimized based on the placement of flip-flops which in turn, can be determined based on the locations of the combinatorial logic devices 110. Flip-flop cross-couple connections can be provided at a higher density on the layer 102 since greater freedom is afforded with a memory state logic level.

Figure 4:
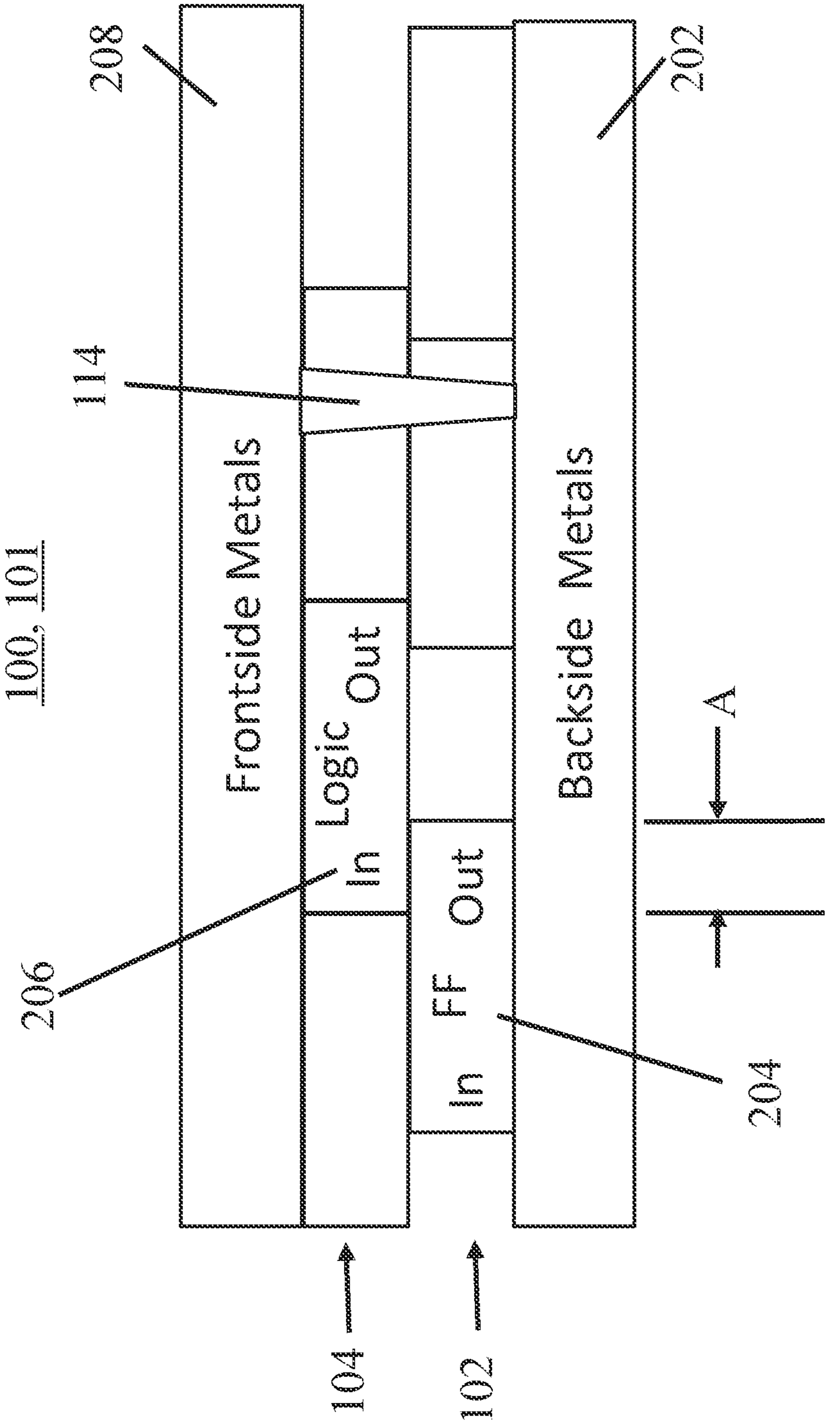
FIG. 4 shows a cross-sectional view a semiconductor device having combinatorial logic devices offset from memory state logic devices and including a via connected between backend of line layers on a frontside and a backside of the semiconductor device, in accordance with an embodiment of the present invention.

Referring to FIG. 4, a cross section of device 100 or 101 shows stacked logic levels of layers 102 and 104 in accordance with an embodiment of the present invention. Layer 102 includes memory storage logic devices such as flip-flops 204. Layer 104 includes combinatorial logic devices 206. The flip-flops 204 can be offset from or overlapped with combinatorial logic devices 206 by a dimension "A" to provide improved operation and/or improve device density for the device 100, 101. In some embodiments, the dimension "A" can be ½ CPP although other offsets can be employed. In the parallel arrangement of FIG. 3, ½ CPP permits a direct connection from a gate on one layer to a source/drain region on the other layer. For example, a gate on layer 102 could connect directly to a source/drain region on layer 104 (and vice versa) as a result of the offset, dimension "A" being ½ CPP.

A back end of line (BEOL) layer 202 (e.g., backside metal) can serve layer 102 components while a BEOL layer 208 (e.g., frontside metals) can serve layer 104. By parsing out the metal structures to serve a specific layer, less metal routing is needed. Less metal means decreased signal delays, less expense in manufacturing and improved performance (e.g., less crosstalk, less current leakage, etc.).

Two levels can be connected to respective sides of the device 100, 101 by vias 114 or other metal structures. For example, the layer 104 can be connected to the backside BEOL layer 202 while the layer 104 can be connected to the frontside BEOL layer 208 using via 114. The frontside and the backside can be connected by vias 114 that can connect across the layers 102 and 104 and can carry signals or different power supply voltages, as needed. The vias 114 can include through silicon vias (TSV), if needed. Wiring connections of first level devices (e.g., layer 102) can be on the backside while wiring connections of second level devices (e.g., layer 104) can be on the frontside. Clock signals and a clock network can be accessed, e.g., from the backside BEOL layer 202 to the memory state logic of layer 102.

In an embodiment, layer 102 can be run on a first supply voltage (e.g., Vdd1) provided through BEOL layer 202 while layer 104 can be run on a second supply voltage (e.g., Vdd2) through BEOL layer 208. Vdd1 and Vdd2 do not have to be equal. One or more supply voltages can be independently provided to each layer 102 and 104 from respective BEOL layers 202 and 208.

In the embodiment shown, flip-flops 204 have input (In) and output (Out) on opposite sides of the circuit/cell. Combinatorial logic devices 206 have input (In) and output (Out) on opposite sides of the circuit/cell. In an embodiment, the flip-flops 304 have input (In) and/or output (Out) connected to the layer 104 having the combinatorial logic devices 306.

Figure 5:
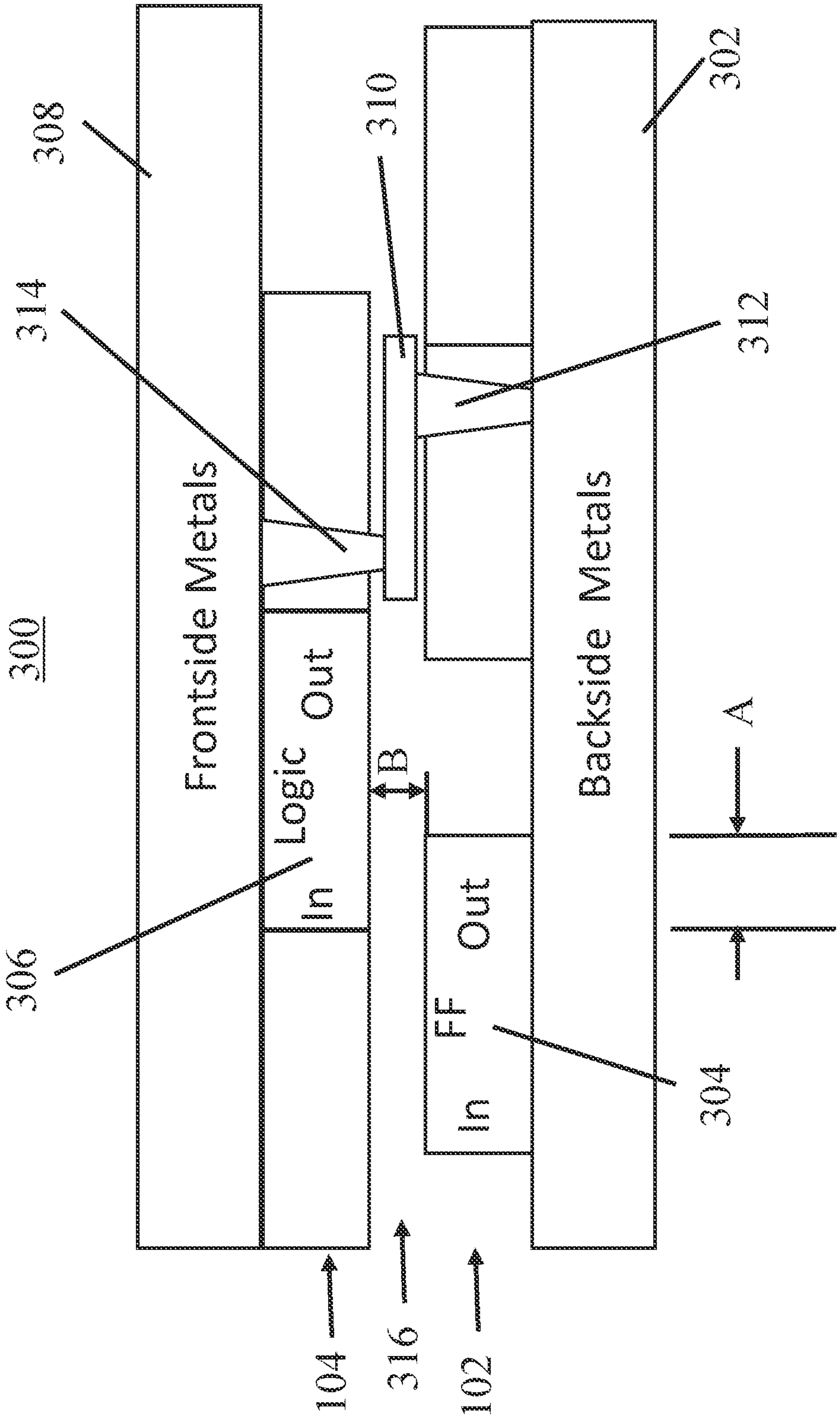
FIG. 5 shows a cross-sectional view a semiconductor device having combinatorial logic devices offset from memory state logic devices and including vias connected by a local interconnect in a space between logic layers, in accordance with an embodiment of the present invention.

Referring to FIG. 5, a cross section of device 300 shows stacked logic levels of layers 102 and 104 in accordance with an embodiment of the present invention. Layer 102 includes memory storage logic devices such as flip-flops 304. Layer 104 includes combinatorial logic devices 306. The flip-flops 304 can be offset from or overlapped with combinatorial logic devices 306 by a dimension "A" to provide improved operation and/or improve device density for the device 300. In the parallel arrangement, ½ CPP permits a direct connection from a gate on one layer to a source/drain region on the other layer. For example, a gate on layer 102 could connect through the gap (dimension "B") to a source/drain region on layer 104 (and vice versa) as a result of the offset, dimension "A".

The devices (e.g., flip-flops 304 and combinatorial logic devices 306) and layers 102, 104 can be gapped by a dimension "B" to provide intermediate layer 316 that can be employed for wiring or other components. In some embodiments, the dimension "A" can be ½ CPP although other offsets can be employed. The dimension "B" can be virtually unlimited as it adds to an overall thickness of the device 300.

A back end of line (BEOL) layer 302 (e.g., backside metal) can serve layer 102 components while a BEOL layer 308 (e.g., frontside metals) can serve layer 104 components. Two levels can be connected to respective sides of the device 300 by vias 312 and 314. A local interconnect 310 can be employed in the intermediate layer 316 to make a connection between vias 312 and 314, although the local interconnect 310 can be employed to connect other components as well. For example, the layer 104 can be connected to the backside BEOL layer 302 while the layer 104 can be connected to the frontside BEOL layer 308 using vias 312, 314 and local interconnect 310.

The frontside and the backside can be connected by vias 312, 314 and local interconnect 310. The vias 312, 314 can include through silicon vias (TSV), if needed. Wiring connections of first level devices (e.g., layer 102) can be on the backside while wiring connections of second level devices (e.g., layer 104) can be on the frontside. Clock signals and a clock network can be accessed, e.g., from the backside BEOL layer 302 to the memory state logic of layer 102.

In an embodiment, layer 102 can be run on a first supply voltage (e.g., Vdd1) provided through BEOL layer 302 while layer 104 can be run on a second supply voltage (e.g., Vdd2) through BEOL layer 308. Vdd1 and Vdd2 do not have to be equal.

In the embodiment shown, flip-flops 304 have input (In) and output (Out) on opposite sides of the circuit/cell. Combinatorial logic devices 306 have input (In) and output (Out) on opposite sides of the circuit/cell. In an embodiment, the flip-flops 304 have input (In) and/or output (Out) connected to the layer 104 having the combinatorial logic devices 306.

Figure 6:
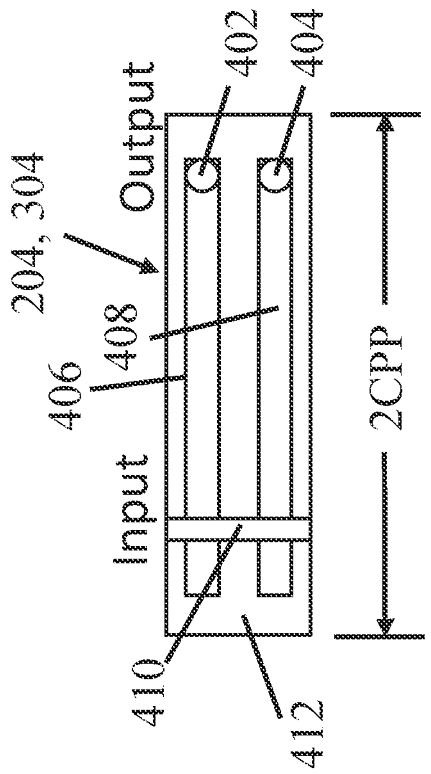
FIG. 6 shows a layout view of a linear flip-flop within 2 CPP, in accordance with an embodiment of the present invention.

Referring to FIG. 6, a layout view of flip-flops 204, 304 are shown in accordance with an embodiment. The flip-flops 204, 304 include a linear layout where an input (Input) and output (Output) are at opposite ends of the flip-flops 204, 304. Nano-through silicon vias (nTSVs) 402, 404 connect to metal lines 406, 408 to an N-type area and a P-type area of active region 412. An input line 410 connects the metal lines 406, 408. Using a stacked logic device in accordance with embodiments of the present invention, a linear flip-flop layout can be realized where the input (Input) and output (Output) of the flip-flop can be within two CPP of each other. The input (Input) and output (Output) of the flip-flop can connect to combinatorial logic on a stacked adjacent layer.

Figure 7:
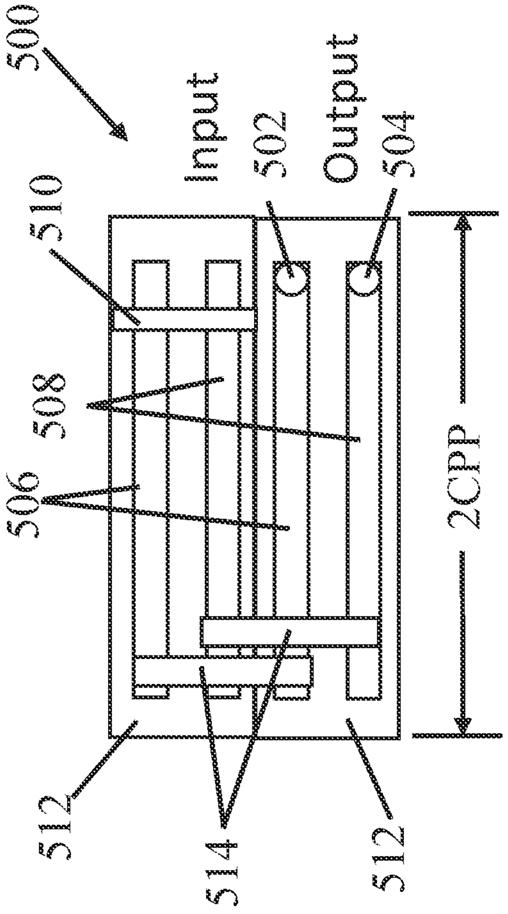
FIG. 7 shows a layout view of a looped or U-shaped flip-flop within 2 CPP, in accordance with an embodiment of the present invention.

Referring to FIG. 7, a layout view of a flip flop logic device 500 is shown in accordance with an embodiment. The flip-flop logic device 500 includes a looped or U-shaped layout where an input (Input) and output (Output) are on a same end of the flip-flop logic device 500. nTSVs 502, 504 connect metal lines 506, 508 to an N-type area and a P-type area of active region 512. An input line 510 connects the metal lines 506, 508. Using a stacked logic device in accordance with embodiments of the present invention, a looped flip-flop layout can be realized where the input (Input) and output (Output) of the flip-flop can be within two CPP of each other. In an embodiment, the flip-flop logic device 500 can have input (In) and/or output (Out) connected to the layer 104 having the combinatorial logic devices 206, 306.

Figure 8:
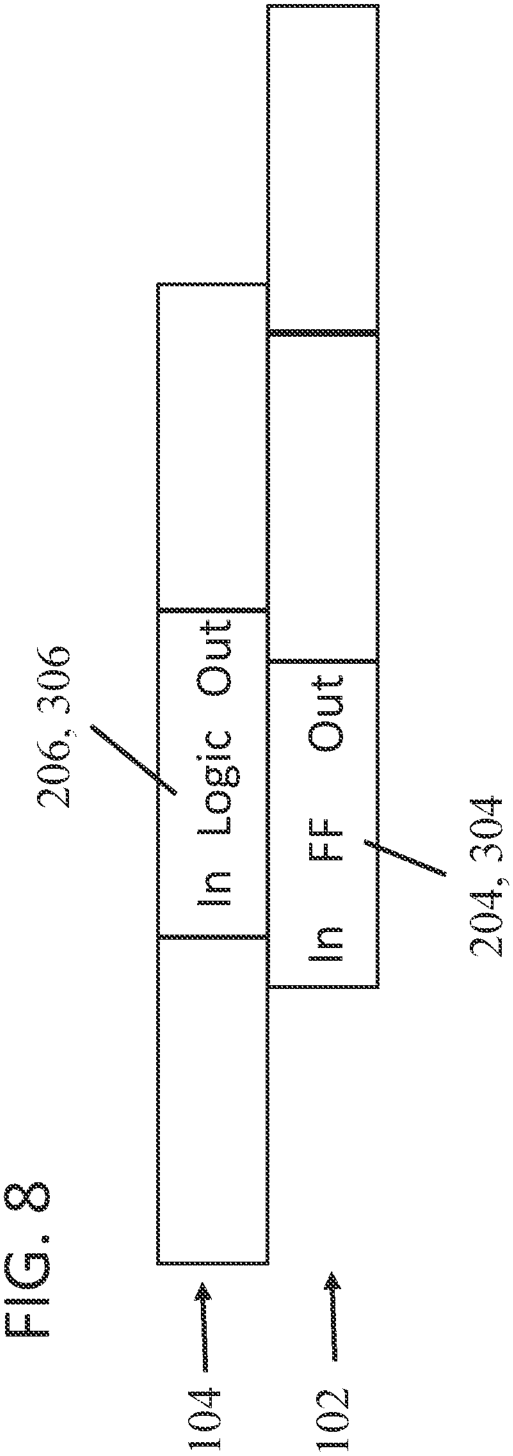
FIG. 8 shows a cross-sectional view of the linear flip-flop with an offset relative to a combinatorial logic device, in accordance with an embodiment of the present invention.

Referring to FIG. 8, a cross-sectional view of the flip-flops 204, 304 of FIG. 6 is shown. The flip-flops 204, 304 are disposed on layer 102 and are offset from the combinatorial logic devices 206, 306 on layer 104. The flip-flops 204, 304 include the linear layout where an input (Input) and output (Output) are at opposite ends of the flip-flops 204, 304. Since the flip-flops 204, 304 and the combinatorial logic devices 206, 306 share a surface or region between them, direct connections can be made between the flip-flops 204, 304 and the combinatorial logic devices 206, 306.

Figure 9:
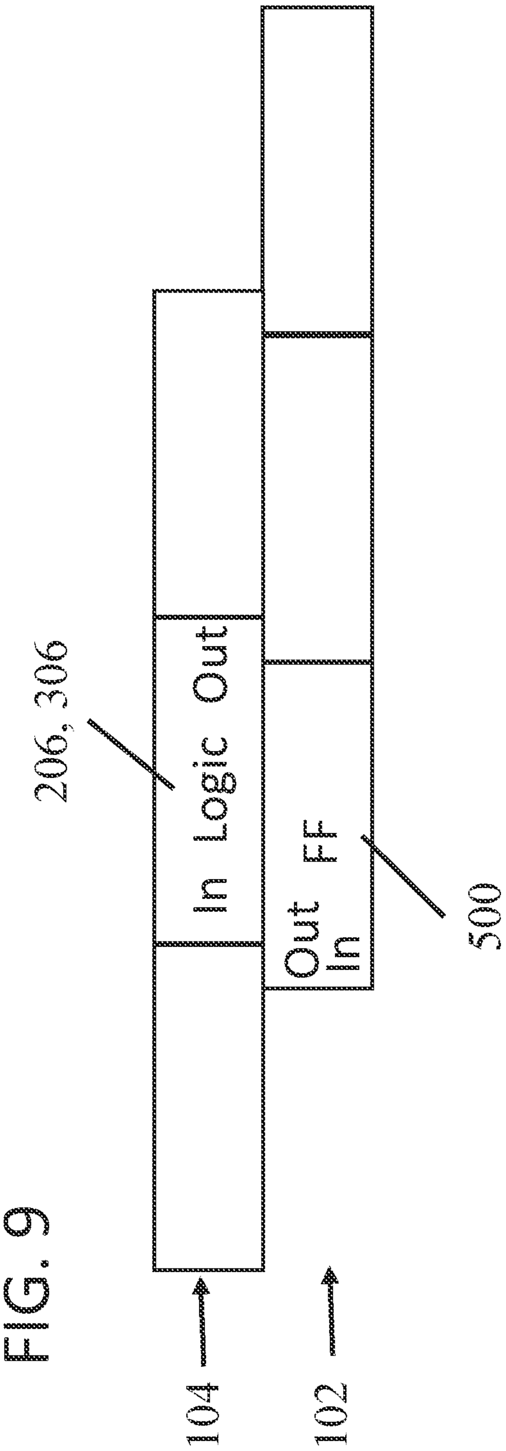
FIG. 9 shows a cross-sectional view of the looped flip-flop with an offset relative to a combinatorial logic device, in accordance with an embodiment of the present invention.

Referring to FIG. 9, a cross-sectional view of the flip flop logic device 500 of FIG. 7 is shown. The flip-flop logic device 500 is disposed on layer 102 and is offset from the combinatorial logic devices 206, 306 on layer 104. The flip-flop logic device 500 includes the looped or U-shaped layout where an input (Input) and output (Output) are on a same end of the flip-flop logic device 500. Since the flip-flop logic device 500 and the combinatorial logic devices 206, 306 share a surface or region between them, direct connections can be made between the flip-flop logic device 500 and the combinatorial logic devices 206, 306. Inputs and outputs for logic devices can be streamlined by direct connections between layers 102, 104.

Circuit operation is improved in accordance with embodiments of the present invention. With the proximity of flip-flops to combinatorial logic (devices can face one another in a more local one to one correspondence), better functionality can be provided. For example, a state in the flip-flops can be saved, which enables a power down of specific portions of the combinatorial logic layer or even specific combinatorial logic devices. In other examples, a faster power restore signal can be delivered to or between devices due to the closer proximity. Increased device density and shorter wire length can result in improved performance since circuit performance improves with reduction in wire length. Cross couple optimization is only needed in one device layer (e.g., in the flip flop layer). Device layers can include CMOS devices in both layers.

In an embodiment, the memory storage logic layer can include bit cells (memory cells) and the combinatorial logic layer can include SRAM peripherals; in memory computations, or stacked cache functions. The flip-flop layer can have, e.g., a single threshold voltage while the combinatorial logic layer can include 2 or 3 threshold voltage levels or types.

Dedicating memory state logic to specific levels significantly reduces level to level logic wiring. In one example, a 7-14 times reduction in level-to-level vias for stacked devices can be achieved. Cost and complexity are minimized by dedicating memory state logic to a separate level. Very low-density connections between levels, cross-couple connections and high-density logic can be dedicated to the memory state logic level.

In an illustrative example design, a total number of instances could be about 50,000, which can include 3,500 flip-flops and 47,000 combinatory logic cells in a single layer with field effect transistors (FET) (both PFET and NFET) accessed through top and bottom. An approximate number of vias includes at least one via per instance and becomes: via count=~50,000 to ~100,000.

In accordance with embodiments of the present invention, the storage device layer and the combinatorial logic layer will include 2 times the number of flip flops plus a few more flip-flops for miscellaneous signal processing. Then, the top and bottom device via count will be ~7,000. This represents a reduction in via count of between 7 and 14 times.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom," "backside," "frontside" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
- a first logic layer including first complementary metal oxide (CMOS) logic devices; and
- a second logic layer stacked on the first logic layer and including second CMOS logic devices, wherein the second logic layer is powered independently from the first logic laver;
- wherein a placement of the second CMOS logic devices relative to the first CMOS logic devices increases device density and reduces via count.

2. The semiconductor device as recited in claim 1, wherein the first CMOS logic devices include flip-flops, and the second CMOS logic devices include combinatorial logic devices.

3. The semiconductor device as recited in claim 1, wherein the first CMOS logic devices are arranged orthogonally relative to the second CMOS logic devices.

4. The semiconductor device as recited in claim 1, wherein the first CMOS logic devices are arranged in a same direction as the second CMOS logic devices.

5. The semiconductor device as recited in claim 1, wherein the first CMOS logic devices are offset from the second CMOS logic devices.

6. The semiconductor device as recited in claim 1, wherein the first CMOS logic devices are offset from the second CMOS logic devices such that gates align with a source/drain regions between the first logic layer and the second logic layer.

7. A semiconductor device, comprising:
- a first back end of line (BEOL) layer;
- a first logic layer including first complementary metal oxide (CMOS) logic devices on the first BEOL layer;
- a second logic layer stacked on the first logic layer and including second CMOS logic devices, wherein the second logic layer is powered independently from the first logic layer; and
- a second BEOL layer on the second logic layer;
- wherein a placement of the second CMOS logic devices relative to the first CMOS logic devices increases device density and reduces vis count.

8. The semiconductor device as recited in claim 7, wherein the first CMOS logic devices include flip-flops, and the second CMOS logic devices include combinatorial logic devices.

9. The semiconductor device as recited in claim 7, wherein the first CMOS logic devices are arranged orthogonally relative to the second CMOS logic devices.

10. The semiconductor device as recited in claim 7, wherein the first CMOS logic devices are arranged in a same direction as the second CMOS logic devices.

11. The semiconductor device as recited in claim 7, wherein the first CMOS logic devices are offset from the second CMOS logic devices such that gates align with a source/drain regions between the first logic layer and the second logic layer.

12. The semiconductor device as recited in claim 7, wherein the first BEOL layer supplies a first supply voltage to the first CMOS logic devices and the second BEOL layer supplies a second supply voltage to the second CMOS logic devices and the first and second supply voltages have different values.

13. The semiconductor device as recited in claim 7, wherein the first BEOL layer connects to the second BEOL layer by vias.

14. The semiconductor device as recited in claim 7, further comprising a space between the first logic layer and the second logic layer wherein the first BEOL layer connects to the second BEOL layer by vias connected by a local interconnect disposed within the space.

15. A semiconductor device, comprising:
- a first back end of line (BEOL) layer;
- a first logic layer including first complementary metal oxide (CMOS) logic devices on the first BEOL layer, the first BEOL layer supplies a first supply voltage to the first CMOS logic devices;
- a second logic layer stacked on the first logic layer and including second CMOS logic devices; and
- a second BEOL layer on the second logic layer, the second BEOL layer supplies a second supply voltage to the second CMOS logic devices and the first and second supply voltages have different values;
- wherein a placement of the second CMOS logic devices relative to the first CMOS logic devices enable a linear arrangement of vias that traverse the first logic layer and the second logic layer.

16. The semiconductor device as recited in claim 15, wherein the first CMOS logic devices include flip-flops, and the second CMOS logic devices include combinatorial logic devices.

17. The semiconductor device as recited in claim 15, wherein the first CMOS logic devices are arranged orthogonally relative to the second CMOS logic devices.

18. The semiconductor device as recited in claim 15, wherein the first CMOS logic devices are arranged in a same direction as the second CMOS logic devices.

19. The semiconductor device as recited in claim 15, wherein the first CMOS logic devices are offset from the second CMOS logic devices such that gates align with a source/drain regions between the first logic layer and the second logic layer.

20. The semiconductor device as recited in claim 15, further comprising a space between the first logic layer and the second logic layer wherein the first BEOL layer connects to the second BEOL layer by vias connected by a local interconnect disposed within the space.

* * * * *